United States Patent
Proehl

(10) Patent No.: US 7,180,372 B2
(45) Date of Patent: Feb. 20, 2007

(54) HIGH FREQUENCY AMPLIFIER

(75) Inventor: Gregory Proehl, Woodstock, IL (US)

(73) Assignee: STMicroelectronics, Inc., Carrollton, TX (US)

( * ) Notice: Subject to any disclaimer, the term of this patent is extended or adjusted under 35 U.S.C. 154(b) by 153 days.

(21) Appl. No.: 11/006,453

(22) Filed: Dec. 7, 2004

(65) Prior Publication Data

US 2006/0119433 A1    Jun. 8, 2006

(51) Int. Cl.
*H03F 3/68* (2006.01)

(52) U.S. Cl. .................. 330/295; 330/124 R; 330/302; 330/129

(58) Field of Classification Search ................ 330/295, 330/124 R, 302, 129
See application file for complete search history.

(56) References Cited

U.S. PATENT DOCUMENTS

| | | | | |
|---|---|---|---|---|
| 4,656,434 A | * | 4/1987 | Selin | ............................ 330/84 |
| 4,763,074 A | * | 8/1988 | Fox | ............................ 324/314 |
| 5,969,681 A | * | 10/1999 | O'Neill, Jr. | .......... 343/700 MS |
| 6,297,696 B1 | | 10/2001 | Abdollahian et al. | |
| 6,711,392 B1 | | 3/2004 | Gillis | |
| 6,940,916 B1 | * | 9/2005 | Warner et al. | ............... 375/261 |
| 2002/0113655 A1 | * | 8/2002 | Lautzenhiser et al. | ...... 330/295 |
| 2002/0171477 A1 | | 11/2002 | Nakayama et al. | |
| 2002/0190790 A1 | | 12/2002 | Cheng et al. | |
| 2004/0095190 A1 | | 5/2004 | Klaren et al. | |
| 2004/0150473 A1 | | 8/2004 | Hollingsworth et al. | |

FOREIGN PATENT DOCUMENTS

DE    33 24 540 A1    1/1985
DE    102 21 661 A1    12/2003

OTHER PUBLICATIONS

EPO Appl. No. 05257534.7, European Search Report, Feb. 2006.

* cited by examiner

*Primary Examiner*—Patricia Nguyen
(74) *Attorney, Agent, or Firm*—Lisa K. Jorgenson; Renee Michelle Leveque

(57) ABSTRACT

An amplifier for amplifying an input signal in a frequency band, has a quadrature signal divider for dividing the input signal into first and second components. The first component is amplified in a first transistor amplifier having a first frequency response to produce a first amplified component. The second component is amplified in second transistor amplifier having a second frequency response, different to the first frequency response, to produce a second amplified component. The first and second amplified components are combined in a quadrature signal combiner to produce an amplified input signal. The frequency response of the amplifier is related to the sum of the first frequency response and second frequency response.

19 Claims, 4 Drawing Sheets

HIGH FREQUENCY AMPLIFIER

FIELD

This invention relates generally to the field of high frequency electronic amplifiers. More particularly, this invention relates to a high frequency amplifier with improved gain flatness.

BACKGROUND

Radio frequency amplifiers are used to amplify received communication signals before they are demodulated and decoded. Example signals include L-band modulated MPEG-2 signals broadcast from a satellite service. The signals may be demodulated and decoded in an integrated receiver/decoder (IRD) such as a television set top box. The IRD can be connected to a distributed infrastructure to allow multiple users to view the information encoded in the signal, or to single television set to view video content encoded in the signal. A simple amplifier may be used, such as START420 amplifier manufactured by ST Microelectronics. The START420 amplifier is a simple generic bipolar junction transistor (BJT) device designed for amplifying radio frequency (RF) signals. Such amplifiers exhibit a gain tilt of about 4.5 dB from 950 MHz to 2.5 GHz, and the input return loss is very poor. In order to use such an amplifier in a direct broadcast satellite (DBS) system, the bias network, input and output matching networks are modified. However, the gain tilt and input return loss are still worse than specified for some systems.

The input return loss can be improved by using a balanced amplifier design that has two identical amplifiers connected between quadrature hybrids, such as Lange couplers or branchline couplers. However, this increases the power draw of the amplifier and does not improve the gain tilt.

BRIEF DESCRIPTION OF THE DRAWINGS

The novel features believed characteristic of the invention are set forth in the appended claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

Figure 1:
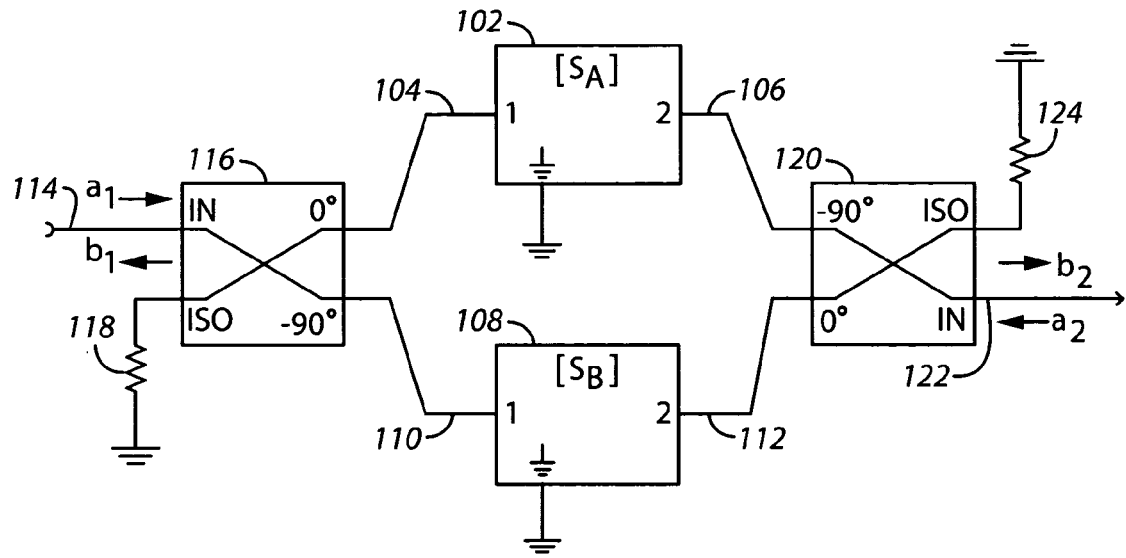
FIG. 1 is a diagrammatic representation of an amplifier consistent with certain embodiments of the present invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The present invention relates to an amplifier circuit for amplifying an input signal in a frequency band. An exemplary embodiment of the invention is shown in FIG. 1. Referring to FIG. 1, the amplifier comprises a first transistor amplifier 102 that receives an input 104 and produces an output 106, and a second transistor amplifier 108 that receives an input 110 and produces an output 112. The input signal 114 is applied to a quadrature signal divider 116 that divides the input signal into a first component 104 and a second component 110 that provide the inputs to the transistor amplifiers 102 and 108, respectively. The quadrature signal divider 116 may be Lange coupler or branch-line coupler for example. The second input to the quadrature signal divider 116 is isolated and coupled to ground through resistor 118. The outputs 106 and 112 from the transistor amplifiers are combined in a quadrature signal combiner 120 to produce the amplified output signal 122. The second output from the quadrature signal combiner 120 is isolated and coupled to ground through resistor 124. The resistors 118 and 124 are selected to match the amplifier impedance to the system requirements. For example, for a 75 Ω system, such as a Direct Broadcast Satellite (DBS) system, 75 Ω resistors are used.

As shown in FIG. 1, the input signal 114 is composed of an incident component with amplitude $a_1$, and an exiting component with amplitude $b_1$. The output signal 122 is composed of an incident component with amplitude $a_2$, and an exiting component with amplitude $b_2$. These components are related by the equation $$\begin{bmatrix} b_1 \\ b_2 \end{bmatrix} = \frac{1}{2} \begin{bmatrix} S_{11A} - S_{11B} & -j(S_{12A} + S_{12B}) \\ -j(S_{21A} + S_{21B}) & -(S_{22A} - S_{22B}) \end{bmatrix} \begin{bmatrix} a_1 \\ a_2 \end{bmatrix}, \quad (1)$$

where the elements $S_{nmA}$ and $S_{nmB}$ are the S-parameters of transistor amplifiers 102 and 108, respectively. The S-parameters are dependent upon frequency.

When $a_2=0$, the output 122 is related to the input 114 by the relationship $$b_2 = -\frac{j}{2}(S_{21A} + S_{21B})a_1, \quad (2)$$

where $S_{21A}$ is the frequency response of the first transistor amplifier and $S_{21B}$ is the frequency response of the second transistor amplifier. The overall frequency response of the amplifier is given by $$S_{21} = -\frac{j}{2}(S_{21A} + S_{21B}). \quad (3)$$

The amplifier structure is shown in FIG. 1 is commonly used in balanced amplifiers in which the first and second amplifiers are matched. This approach guarantees that diagonal terms in the scattering matrix in equation (1), which denote the input and output return losses, are zero and reflections from the amplifier are minimized. However, the overall frequency response of the amplifier, as given in equation (3), has the same gain (magnitude) response as the individual amplifiers. In accordance with one aspect of the present invention, the first and second amplifiers are designed to have different frequency responses, so the overall frequency response has a flatter gain than the either of the first or second amplifiers.

Figure 2:
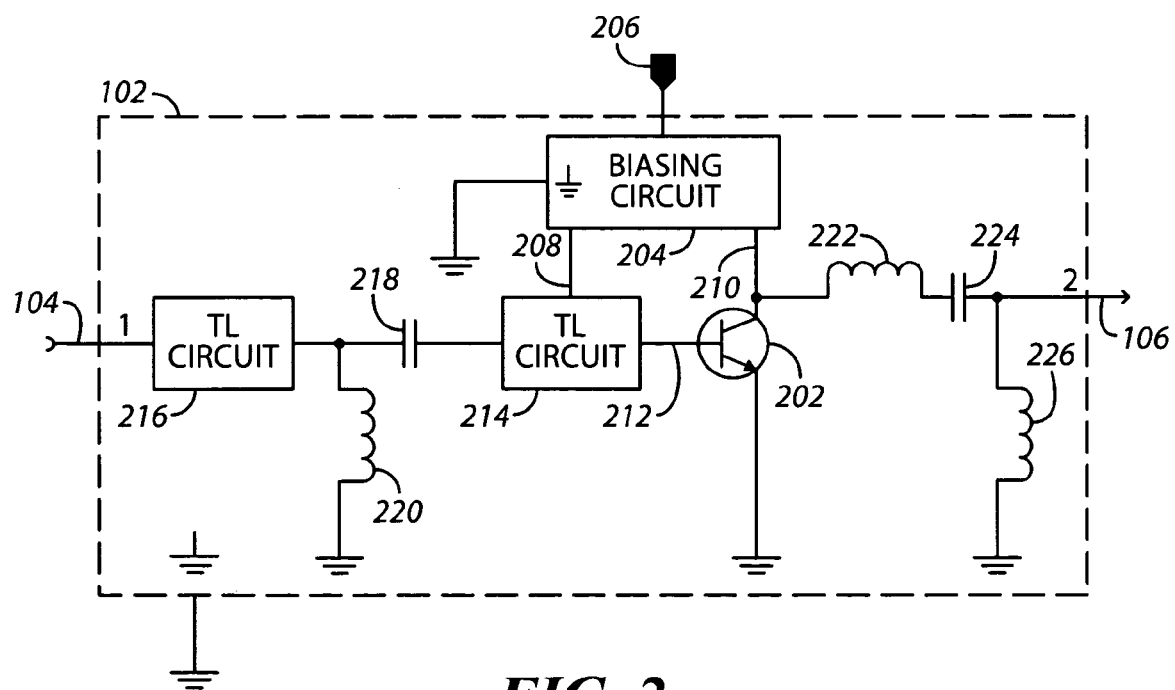
FIG. 2 is a circuit diagram of a transistor amplifier consistent with certain embodiments of the present invention.

An exemplary embodiment of a transistor amplifier 102 is shown in FIG. 2. The transistor amplifier 108 may have a similar structure. Referring to FIG. 2, a transistor 202, such as a bipolar junction transistor (BJT) or a field effect transistor (FET), is biased by a biasing circuit 204. The biasing circuit 204 is powered by a power supply 206 and provides DC bias voltages 208 and 210 that are respectively applied to the base (gate) and collector of the transistor 202. In this embodiment, the base bias voltage 208 is coupled to the filtered input signal in circuit 214 that may be modeled as a microwave transmission line circuit. The input 104 to the amplifier is passed through an input impedance matching circuit comprising circuit 216 (that may be modeled as a microwave transmission line circuit), capacitor 218 and inductor 220. The capacitor 218 serves as a blocking capacitor that allows a difference in DC voltage across it without altering the circuit operation at AC frequencies. This is sometimes referred to as an AC coupled circuit which keeps the bias DC voltage from affecting the source connected to the input of the amplifier. The capacitor 218 is also used for impedance matching of the transistor biasing circuit to the input impedance requirements of the system. The circuit 214 and the biasing circuit 204 also affect the input impedance.

The output from transistor 202 is passed through an output impedance matching circuit that comprises inductor 222, capacitor 224, inductor 226 and components of the biasing circuit 204. The capacitor 224 serves as a blocking capacitor that allows a difference in DC voltage across it without altering the circuit operation at AC frequencies.

Figure 3:
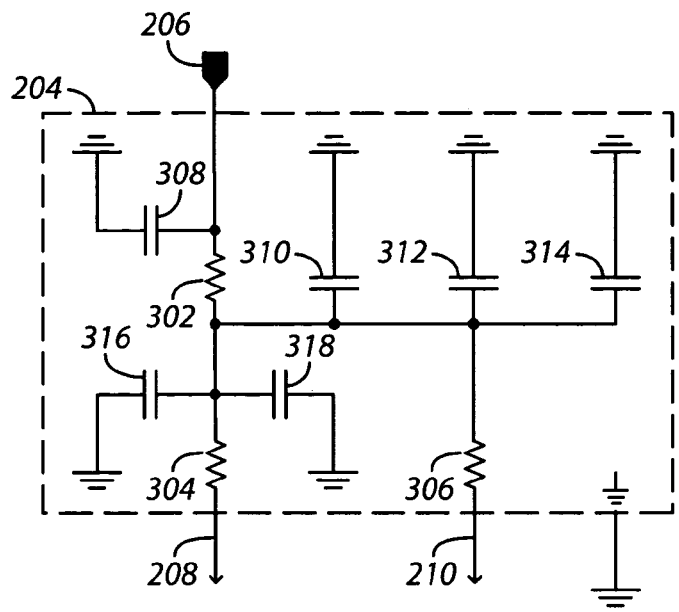
FIG. 3 is a circuit diagram of a transistor amplifier biasing circuit consistent with certain embodiments of the present invention.

An exemplary biasing circuit 204 is shown in FIG. 3. The bias signal 208 is obtained by passing the power supply signal 206 through resistors 302 and 304. The bias signal 210 is obtained by passing the power supply signal 206 through the resistors 302 and 306. Capacitors 308, 310, 312, 314, 316 and 318 are power supply and bias filters used to filter out power supply ripple and noise.

Figure 4:
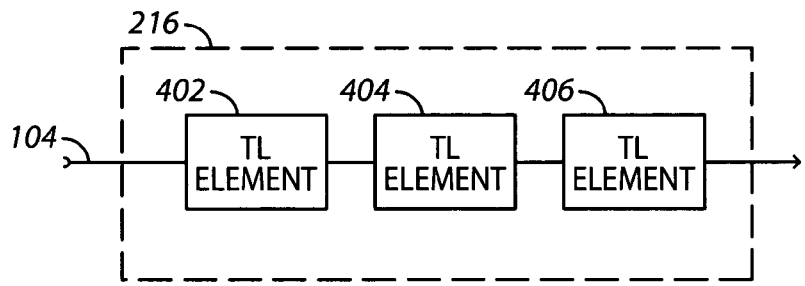
FIG. 4 is a sub-circuit diagram of a transistor amplifier input consistent with certain embodiments of the present invention.

An exemplary circuit 216 used in input impedance matching is shown in FIG. 4. Referring to FIG. 4, the circuit 216 comprises a series arrangement of microwave transmission line elements 402, 404 and 406.

Figure 5:
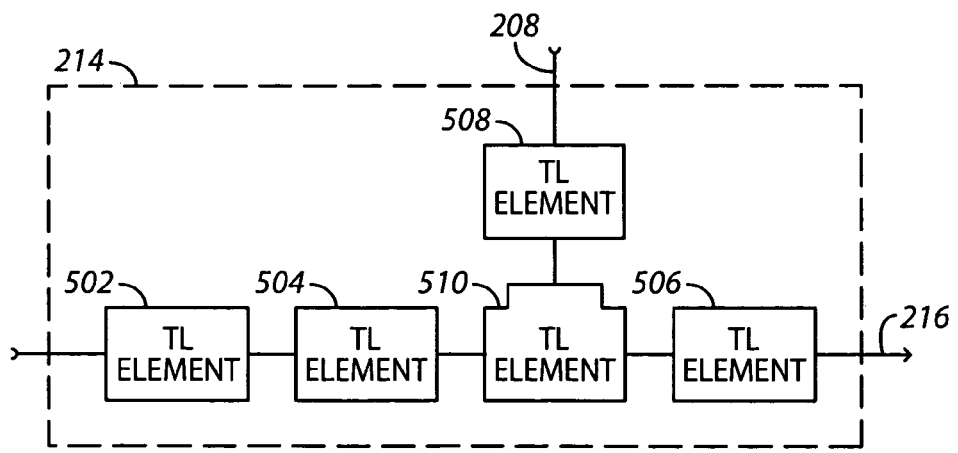
FIG. 5 is a sub-circuit diagram of a transistor amplifier consistent with certain embodiments of the present invention.

An exemplary bias coupling circuit 214 is shown in FIG. 5. Referring to FIG. 5, the circuit 216 comprises microwave transmission line elements 502, 504, 506 and 508 and microwave tee transmission line element 510.

Figure 6:
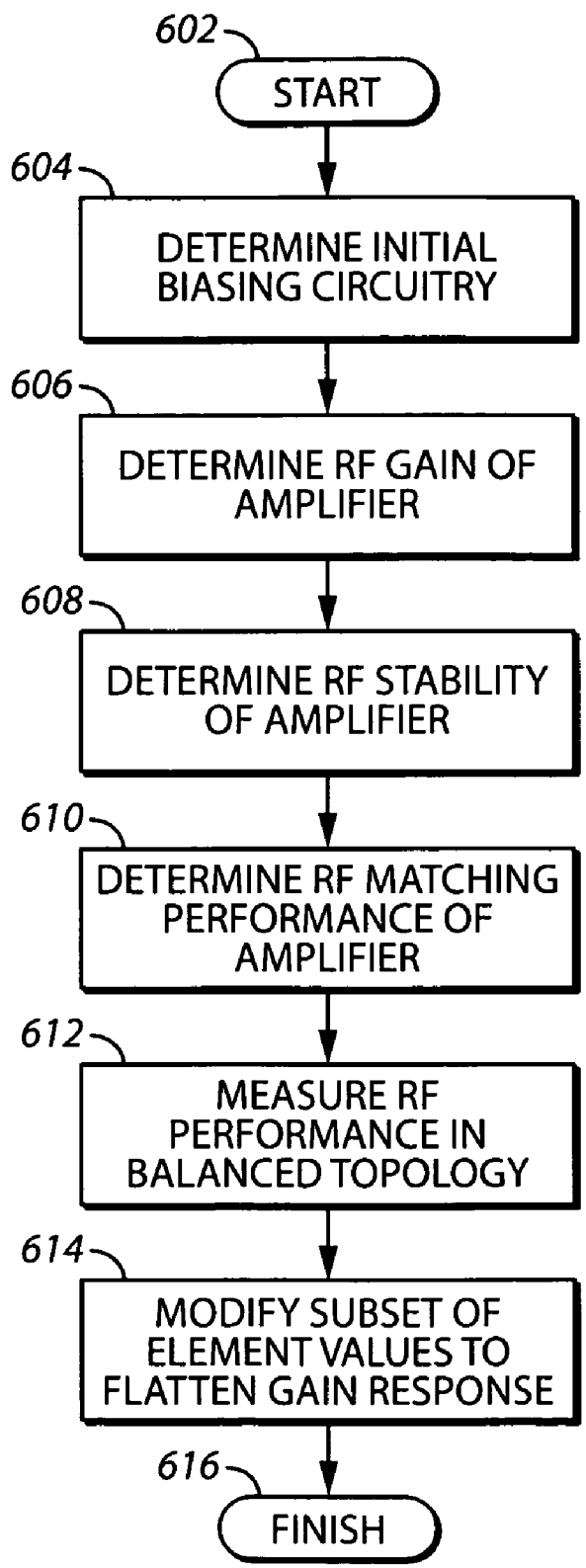
FIG. 6 is flow chart of a method consistent with certain embodiments of the present invention.

FIG. 6 is a flow chart depicting a method for selecting the values of circuit components in accordance with certain embodiments of the present invention. Following start block 602 in FIG. 6, the initial DC biasing circuitry of the transistor is determined at block 604. This may be done by setting the DC operating point of the transistor to the approximate middle of its operating range so the AC signals can swing equally around the operating point to minimize the distortion. The types of bias circuitry components and layouts are determined by the type of device used and preferences of the designer. At block 606 the RF gain of the amplifier is determined. By measuring the S-parameters of the transistor only, one can determine what input and output matching parameters are used in order to best input and output match the device over the required bandwidth. At block 608, the RF stability of the amplifier is determined. This will determine if the amplifier will go into an unexpected oscillation and is conditionally, or unconditionally stable. The RF matching performance is determined at block 610. The input and output matching networks of the amplifier are designed to match the source and load impedances. At block 612, two amplifiers are placed in a balanced topology, as in FIG. 1, and the RF performance is measured. Finally, at block 614, a subset of the amplifier elements is selected and their values are modified iteratively, to achieve to required amplifier response. For example, the $S_{21}$ parameter may be monitored for flatness in a frequency band of interest. The process terminates at block 616.

It will be apparent to those of ordinary skill in the art that embodiments of the amplifier of the present invention may be operated in frequency bands other than radio frequency bands. For example, the amplifier could be used for microwave frequencies.

This process of component value selection can be automated using standard microwave CAD software packages with optimization features. For example, a set of design variables (component models) are selected and then adjusted to optimize a performance variable. In the example provided in Table 1 and Table 2 below, the input and output matching circuit elements and the bias circuit elements were adjusted in order to achieve a flat $S_{21}$ response.

The amplifier component values for one embodiment of the invention are given in Table 1.

TABLE 1

| Component | 1st Amplifier | 2nd Amplifier |
|---|---|---|
| 218 | 62.459 pF | 59.206 pF |
| 220 | 20 nH | 20 nH |
| 222 | 1 nH | 1 nH |
| 224 | 2.078 Ω | 2.078 Ω |
| 226 | 6.12 nH | 6.12 nH |
| 302 | 27 Ω | 27 Ω |
| 304 | 25525.631 Ω | 25525.631 Ω |
| 306 | 120.685 Ω | 120.685 Ω |
| 308 | 1 µF | 1 µf |
| 310 | 10 nF | 10 nF |
| 312 | 100 pF | 100 pF |
| 314 | 10 nF | 10 nF |
| 316 | 97.057 pF | 200 pF |
| 318 | 10 nF | 10 nF |

Note that elements 218 and 316 have different values in the two transistor amplifiers.

The microwave transmission line parameters are given in Table 2.

TABLE 2

|  | 1st Amplifier | | 2nd Amplifier | |
| --- | --- | --- | --- | --- |
| Element | W | L | W | L |
| 402 | .197 in | .336 in | .161 in | .338 in |
| 404 | .02 in | .05 in | .02 in | .05 in |
| 406 | .04 in | .02 in | .04 in | .02 in |
| 502 | .04 in | .02 in | .04 in | .02 in |
| 504 | .02 in | .05 in | .02 in | .05 in |
| 506 | .126 in | .36 in | .098 in | .441 in |
| 508 | .126 in | .117 in | .081 in | .251 in |

Note that elements 402, 506 and 508 have different values in the two transistor amplifiers. Thus, the input and output impedance matching circuits have been altered, as has the biasing circuit. In other embodiments of the invention, the collector bias circuit may also be altered. In still further embodiments, one or more of the input matching circuit, the output matching circuit, the base bias circuit and the collector bias circuits may be altered.

Figure 7:
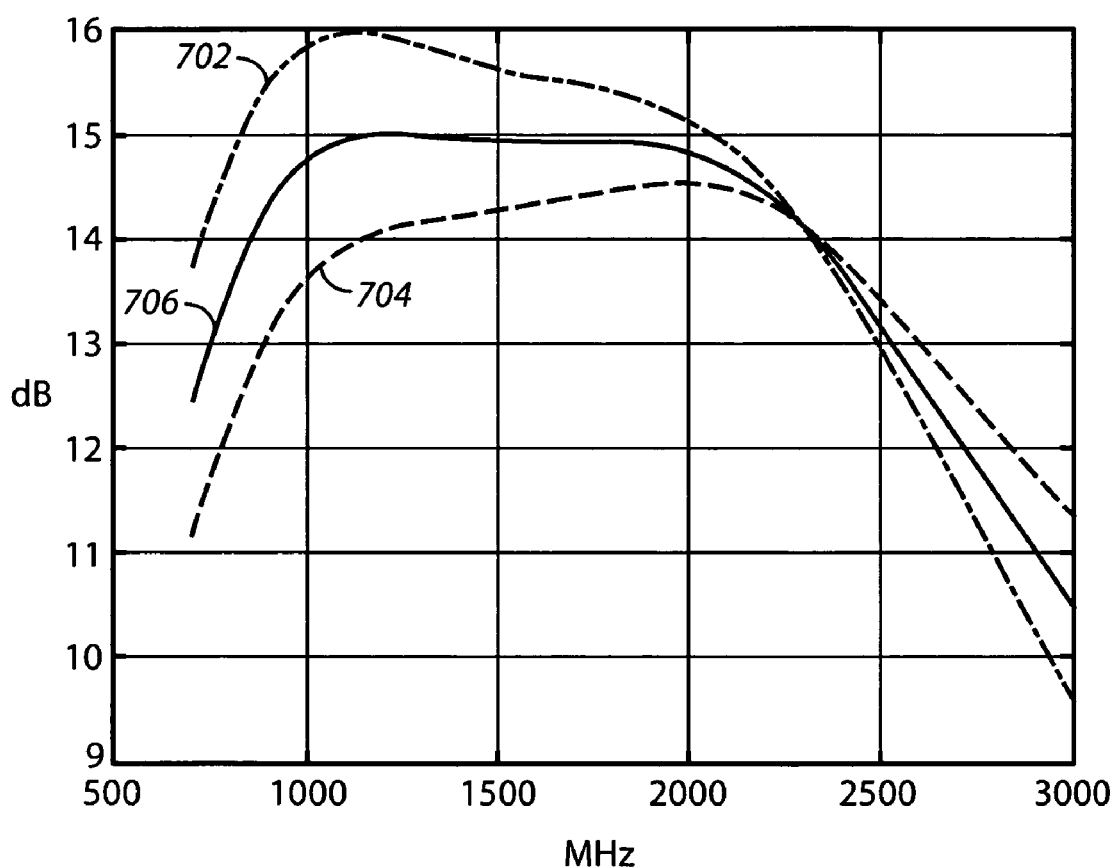
FIG. 7 is a graph of showing the gains of first and second transistor amplifiers and an overall gain in accordance with a embodiment of the present invention.

FIG. 7 is a graph of $S_{21}$ parameters of various amplifiers as a function of frequency in MHz. The plot 702 shows the $S_{21}$ parameter, or gain, of the first transistor amplifier. The plot 704 shows the $S_{21}$ parameter of the second transistor amplifier. The plot 706 shows the $S_{21}$ parameter of a parallel combination of the first and second transistor amplifiers, i.e. the overall gain of the amplifier. It can be seen that the first and second amplifiers have maximum gains at different frequencies and that the parallel combination provides a flatter frequency response.

Since the amplifiers in the parallel amplifier arrangement of the present invention are not balanced, the diagonal elements $S_{11}$ and $S_{22}$ of the scattering matrix, which denote input and output return losses, are not zero. However, they are much reduced from return losses of a single transistor amplifier. The return losses may be included in the component value optimization to ensure that the losses meet the system requirements.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. An amplifier for amplifying an input signal in a frequency band, comprising:
    a quadrature signal divider operable to divide the input signal into a first component and a second component;
    a first transistor amplifier having a first frequency response and operable to amplify the first component to produce a first amplified component;
    a second transistor amplifier having a second frequency response, different to the first frequency response, and operable to amplify the second component to produce a second amplified component; and
    a quadrature signal combiner operable to combine the first amplified component and the second amplified component to produce an amplified input signal,
wherein the frequency response of the amplifier is related to a sum of the first frequency response and second frequency response.

2. An amplifier in accordance with claim 1, wherein the first transistor amplifier comprises:
    a first transistor;
    a first biasing circuit operable to bias the first transistor;
    a first input impedance matching circuit coupled to the first transistor and including a first input bias blocking capacitor; and
    a first output impedance matching circuit coupled to the first transistor and including a first output bias blocking capacitor,
and wherein the second transistor amplifier comprises:
    a second transistor;
    a second biasing circuit operable to bias the second transistor;
    a second input impedance matching circuit coupled to the second transistor and including a second input bias blocking capacitor; and
    a second output impedance matching circuit coupled to the second transistor and including a second output bias blocking capacitor.

3. An amplifier in accordance with claim 2, wherein the first transistor and the second transistor are matched.

4. An amplifier in accordance with claim 2, wherein the first and second biasing circuits have the same structure and an element of the first biasing circuit has a different value to a corresponding element of the second biasing circuit.

5. An amplifier in accordance with claim 2, wherein the first and second input impedance matching circuits have the same structure and an element of the first input impedance matching circuit has a different value to a corresponding element of the second input impedance matching circuit.

6. An amplifier in accordance with claim 2, wherein the first and second output impedance matching circuits have the same structure and an element of the first output impedance matching circuit has a different element value to a corresponding component of the second output impedance matching circuit.

7. An amplifier in accordance with claim 2, wherein the first transistor amplifier further comprises a first transmission line element and the second transistor amplifier further comprises a second transmission line element, the first transmission line element having a different characteristic to the second transmission line element.

8. An amplifier in accordance with claim 2, wherein the first and second transistors are bipolar junction transistors.

9. An amplifier in accordance with claim 2, wherein the first and second transistors are field effect transistors.

10. An amplifier in accordance with claim 1, wherein the frequency band includes a radio frequency band.

11. An amplifier in accordance with claim 1, wherein the frequency band includes a microwave frequency band.

12. An amplifier in accordance with claim 1, wherein the first frequency response and the second frequency response are selected such that the frequency response of the amplifier is flatter in the frequency band than either the first frequency response or the second frequency response in the frequency band.

13. A method far designing an amplifier circuit with a required frequency response in a frequency band, comprising:
    determining initial voltage biasing circuitry for a transistor in a first transistor amplifier;
    determining the gain of the first transistor amplifier in the frequency band;
    determining the stability of the first transistor amplifier;
    determining the matching performance of the first transistor amplifier;

predicting the performance of the first transistor amplifier connected in a balanced topology with a second transistor amplifier having the same structure as the first transistor amplifier; and adjusting the component values of a subset of elements of the second transistor amplifier to achieve to required frequency response.

14. A method in accordance with claim 13 wherein adjusting component values of a subset of elements of the second transistor amplifier to achieve to required frequency response comprises performing an iterative search of component values.

15. A method in accordance with claim 13 wherein the iterative search is performed by a computer.

16. A method in accordance with claim 13 wherein the required frequency response is substantially flat in the frequency band.

17. A method for amplifying a signal in a frequency band, comprising:

dividing the signal into in-phase and quadrature components:

amplifying the in-phase component of the signal in a first amplifier to produce an amplified in-phase component;

amplifying the quadrature component of the signal in a second amplifier to produce an amplified quadrature component; and combining the amplified in-phase component and the amplified quadrature component in a quadrature combiner to produce an amplified signal;

wherein a sum of the frequency response of the first amplifier and the frequency response of the second amplifier is flatter in the frequency band than either the frequency response of the first amplifier or the frequency response of the second amplifier.

18. A method in accordance with claim 17, wherein the first and second amplifiers are transistor amplifiers having the same structures and wherein a subset of components in the second amplifier have different components value to a corresponding subset of components in the first amplifier.

19. A method in accordance with claim 17, wherein the first amplifier has a maximum gain at a first frequency in the frequency band and the second amplifier has a maximum gain a second frequency in the frequency band, the first frequency being different to the second frequency.

* * * * *